(12) United States Patent
Kinpara et al.

(10) Patent No.: US 11,348,819 B2
(45) Date of Patent: May 31, 2022

(54) ELECTROSTATIC CHUCK DEVICE

(71) Applicant: SUMITOMO OSAKA CEMENT CO., LTD., Tokyo (JP)

(72) Inventors: Yuuki Kinpara, Tokyo (JP); Ryuuji Hayahara, Tokyo (JP); Kazunori Ishimura, Tokyo (JP); Hitoshi Kouno, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 210 days.

(21) Appl. No.: 16/958,094

(22) PCT Filed: Dec. 11, 2018

(86) PCT No.: PCT/JP2018/045504
§ 371 (c)(1),
(2) Date: Jun. 25, 2020

(87) PCT Pub. No.: WO2019/131115
PCT Pub. Date: Jul. 4, 2019

(65) Prior Publication Data
US 2020/0343125 A1    Oct. 29, 2020

(30) Foreign Application Priority Data
Dec. 28, 2017    (JP) .............................. JP2017-253791

(51) Int. Cl.
*H01L 21/683* (2006.01)
*H01L 21/67* (2006.01)
(Continued)

(52) U.S. Cl.
CPC .... *H01L 21/6833* (2013.01); *H01L 21/67103* (2013.01); *H01L 21/67109* (2013.01);
(Continued)

(58) Field of Classification Search
CPC ............... H01L 21/205; H01L 21/3065; H01L 21/67103; H01L 21/67109;
(Continued)

(56) References Cited

U.S. PATENT DOCUMENTS 6,227,786 B1 * 5/2001 Tateyama .......... H01L 21/67109
118/724
6,465,763 B1 * 10/2002 Ito .......................... H05B 3/265
118/725
(Continued)

FOREIGN PATENT DOCUMENTS

JP    2004-031665 A    1/2004
JP    2016-028448 A    2/2016
(Continued)

OTHER PUBLICATIONS

International Search Report for PCT/JP2018/045504 (dated Feb. 19, 2019).

*Primary Examiner* — Jared Fureman
*Assistant Examiner* — Nicolas Bellido
(74) *Attorney, Agent, or Firm* — Merchant & Gould P.C.

(57) ABSTRACT

An electrostatic chuck device includes: an electrostatic chuck part having, as a main surface, a mounting surface on which a plate-shaped sample is mounted, an electrostatic attraction electrode; a base part configured to cool the electrostatic chuck part; a heater disposed in a layered manner between the electrostatic chuck part and the base part; and an adhesion layer which bonds and integrates the electrostatic chuck part and the base part together, in which the electrostatic chuck part is provided with a first through-hole, the base part is provided with a second through-hole communicating with the first through-hole, the adhesion layer is provided with a third through-hole communicating with the first through-hole and the second through-hole, a tubular insulator is fixed in the second through-hole, and an
(Continued)

end of the insulator located on the electrostatic chuck part side is separated from the electrostatic chuck part with a space interposed therebetween.

9 Claims, 4 Drawing Sheets

(51) Int. Cl.
    *H01L 21/687*      (2006.01)
    *H02N 13/00*      (2006.01)

(52) U.S. Cl.
    CPC .. *H01L 21/67126* (2013.01); *H01L 21/67132* (2013.01); *H01L 21/67248* (2013.01); *H01L 21/6875* (2013.01); *H01L 21/68785* (2013.01); *H02N 13/00* (2013.01)

(58) Field of Classification Search
    CPC ......... H01L 21/67126; H01L 21/67132; H01L 21/67248; H01L 21/6831; H01L 21/6833; H01L 21/6875; H01L 21/68785; H02N 13/00
    See application file for complete search history.

(56) References Cited

U.S. PATENT DOCUMENTS

| | | | | |
|---|---|---|---|---|
| 6,676,805 | B2 * | 1/2004 | Tamura | H01L 21/6835 118/724 |
| 9,142,391 | B2 * | 9/2015 | Yamamoto | H01J 37/32642 |
| 9,202,727 | B2 * | 12/2015 | Dunn | H01L 21/68785 |
| 10,153,192 | B2 * | 12/2018 | Maeta | H01J 37/32697 |
| 2002/0180466 | A1 * | 12/2002 | Hiramatsu | H01L 21/67103 219/209 |
| 2014/0346152 | A1 * | 11/2014 | Sasaki | H01L 21/6831 219/121.58 |
| 2014/0376148 | A1 * | 12/2014 | Sasaki | B23Q 3/15 361/234 |
| 2015/0279714 | A1 * | 10/2015 | Yamaguchi | H01L 21/6833 279/128 |
| 2018/0053678 | A1 * | 2/2018 | Kugimoto | H01L 21/6833 |
| 2018/0201545 | A1 * | 7/2018 | Nagatomo | C04B 35/645 |
| 2019/0019713 | A1 * | 1/2019 | Hidaka | C04B 35/6261 |
| 2019/0019714 | A1 * | 1/2019 | Kosakai | H01L 21/6833 |
| 2019/0043746 | A1 * | 2/2019 | Yoshioka | B25J 11/0095 |
| 2019/0131163 | A1 * | 5/2019 | Kuno | H01L 21/68785 |
| 2019/0244795 | A1 * | 8/2019 | Tandou | H01L 21/67069 |
| 2019/0385884 | A1 * | 12/2019 | Hidaka | H01L 21/6833 |
| 2020/0027770 | A1 * | 1/2020 | Hidaka | H01L 21/6831 |
| 2020/0090959 | A1 * | 3/2020 | Takebayashi | H01L 21/67109 |
| 2020/0211884 | A1 * | 7/2020 | Hidaka | H01L 21/6833 |
| 2020/0395235 | A1 * | 12/2020 | Hayahara | H01L 21/67248 |
| 2021/0013081 | A1 * | 1/2021 | Kosakai | H01L 21/6875 |
| 2021/0020489 | A1 * | 1/2021 | Kugimoto | H01L 21/6833 |
| 2021/0114937 | A1 * | 4/2021 | Hidaka | C04B 35/62625 |

FOREIGN PATENT DOCUMENTS

| | | |
|---|---|---|
| JP | 6420937 B | 11/2018 |
| WO | 2016/093297 A1 | 6/2016 |
| WO | 2017/126534 A | 7/2017 |

* cited by examiner

ELECTROSTATIC CHUCK DEVICE

TECHNICAL FIELD

The present invention relates to an electrostatic chuck device.

This application is a U.S. National Stage Application under 35 U.S.C. 071 of International Patent Application No. PCT/JP2018/045504, filed on Dec. 11, 2018, which claims priority to Japanese Patent Application No. 2017-253791, filed on Dec. 28, 2017, the disclosures of all of which are hereby incorporated by reference in their entireties.

BACKGROUND

In the past, in a semiconductor manufacturing apparatus, an electrostatic chuck device for fixing a plate-shaped sample such as a wafer or a glass substrate to a chucking surface (mounting surface) has been used. The electrostatic chuck device includes an electrostatic chuck part having an electrostatic attraction mechanism, a temperature adjustment base part which cools the electrostatic chuck part, and an adhesion layer which bonds the electrostatic chuck part and the base part together.

As such an electrostatic chuck device, a configuration having through-holes provided in the electrostatic chuck part and the base part to communicate with each other is known. Such through-holes accommodate, for example, a pin for separating the plate-shaped sample held by the electrostatic chuck device from the mounting surface. Further, the through-holes are used for discharging a cooling gas for cooling the plate-shaped sample to the mounting surface.

Insulating sleeves (insulators) are disposed in these through-holes in order to enhance the withstand voltage of the electrostatic chuck device (for example, Patent Literature No. 1).

CITATION LIST

Patent Literature

[Patent Literature No. 1] Japanese Laid-open Patent Publication No. 2004-31665

SUMMARY OF INVENTION

Technical Problem

In the electrostatic chuck device as described above, in order to suppress processing unevenness of the plate-shaped sample held on the mounting surface, it is desired to uniformly control the temperature of the plate-shaped sample in a plane during processing such as plasma processing. However, it is known that the electrostatic chuck device having the through-hole is more easily cooled at a position where the through-hole of the electrostatic chuck part is formed than at a position where the through-hole is not formed and as a result, a temperature difference easily occurs in a plane of the held plate-shaped sample. For this reason, an electrostatic chuck device in which it is possible to reduce an in-plane temperature difference of a plate-shaped sample has been desired.

The present invention has been made in view of such circumstances and has as an object to provide an electrostatic chuck device having a novel structure in which it is possible to reduce an in-plane temperature difference of a plate-shaped sample.

Solution to Problem

In order to solve the above problem, according to a first aspect of the present invention, there is provided an electrostatic chuck device including: an electrostatic chuck part which has, as a main surface, a mounting surface on which a plate-shaped sample is mounted, and is provided with an electrostatic attraction electrode; a base part which is disposed on a side opposite to the mounting surface with respect to the electrostatic chuck part and is configured to cool the electrostatic chuck part; a heater which is disposed in a layered manner between the electrostatic chuck part and the base part or in an interior of the electrostatic chuck part; and an adhesion layer which bonds and integrates the electrostatic chuck part and the base part together, in which the electrostatic chuck part is provided with a first through-hole, the base part is provided with a second through-hole communicating with the first through-hole, the adhesion layer is provided with a third through-hole communicating with the first through-hole and the second through-hole, a tubular insulator is fixed into the second through-hole, and an end of the insulator which is located on the electrostatic chuck part side is separated from the electrostatic chuck part with a space interposed therebetween.

The first aspect of the present invention preferably has the following features. It is also preferable that the following features are combined with each other.

In the first aspect of the present invention, a configuration may be adopted in which the base part has a counterbore hole, which communicates with the second through-hole, has a larger diameter than a diameter of the second through-hole, and is provided on a surface of the base part on the electrostatic chuck part side.

In the first aspect of the present invention, a configuration may be adopted in which the third through-hole has a larger diameter than a diameter of the first through-hole.

In the first aspect of the present invention, a configuration may be adopted in which the heater has a band-shaped first portion which is formed to surround the first through-hole when viewed in a plan view, and a band-shaped second portion which is formed farther from the first through-hole than the first portion, the first portion and the second portion are connected to each other, and a width of the first portion is smaller than a width of the second portion.

In the first aspect of the present invention, a configuration may be adopted in which the base part has a flow path through which a refrigerant flows, the heater has a band-shaped first portion which is formed to surround the first through-hole when viewed in a plan view, and a minimum value of a distance between the first portion and the first through-hole when viewed in a plan view is smaller than a minimum value of a distance between the flow path and the first through-hole when viewed in a plan view.

In the first aspect of the present invention, a configuration may be adopted in which the insulator has an end portion on a side opposite to the electrostatic chuck part, wherein the end portion has a fixed portion which is detachably fixed to the base part.

In the first aspect of the present invention, the first through-hole, the third through-hole, the counterbore hole, and the second through-hole may have concentric circular shapes when viewed in a plan view and communicate with each other in this order, and a height of the end of the insulator located in the second through-hole may be equal to a height of a bottom surface of the counterbore hole.

In the first aspect of the present invention, an inner diameter of the first through-hole and an inner diameter of the tubular insulator may be equal to each other.

In the first aspect of the present invention, an inner diameter of the tubular insulator may be larger than an inner diameter of the first through-hole.

Advantageous Effects of Invention

According to the present invention, it is possible to provide an electrostatic chuck device having a novel structure in which it is possible to reduce an in-plane temperature difference of a wafer.

DESCRIPTION OF EMBODIMENTS

First Embodiment

Hereinafter, an electrostatic chuck device according to an embodiment of the present invention will be described with reference to FIGS. 1 to 5. In all the following drawings, in order to make the drawings easier to see, there is a case where the dimension, ratio, or the like of each constituent element is appropriately varied. Further, the following examples are for describing specific preferred examples for better understanding of the gist of the invention and do not limit the invention unless otherwise specified. Omissions, additions, substitutions, and other changes can be made with respect to the number, a position, a size, a ratio, a member, or the like or the like within a scope which does not depart from the gist of the present invention.

Figure 1:
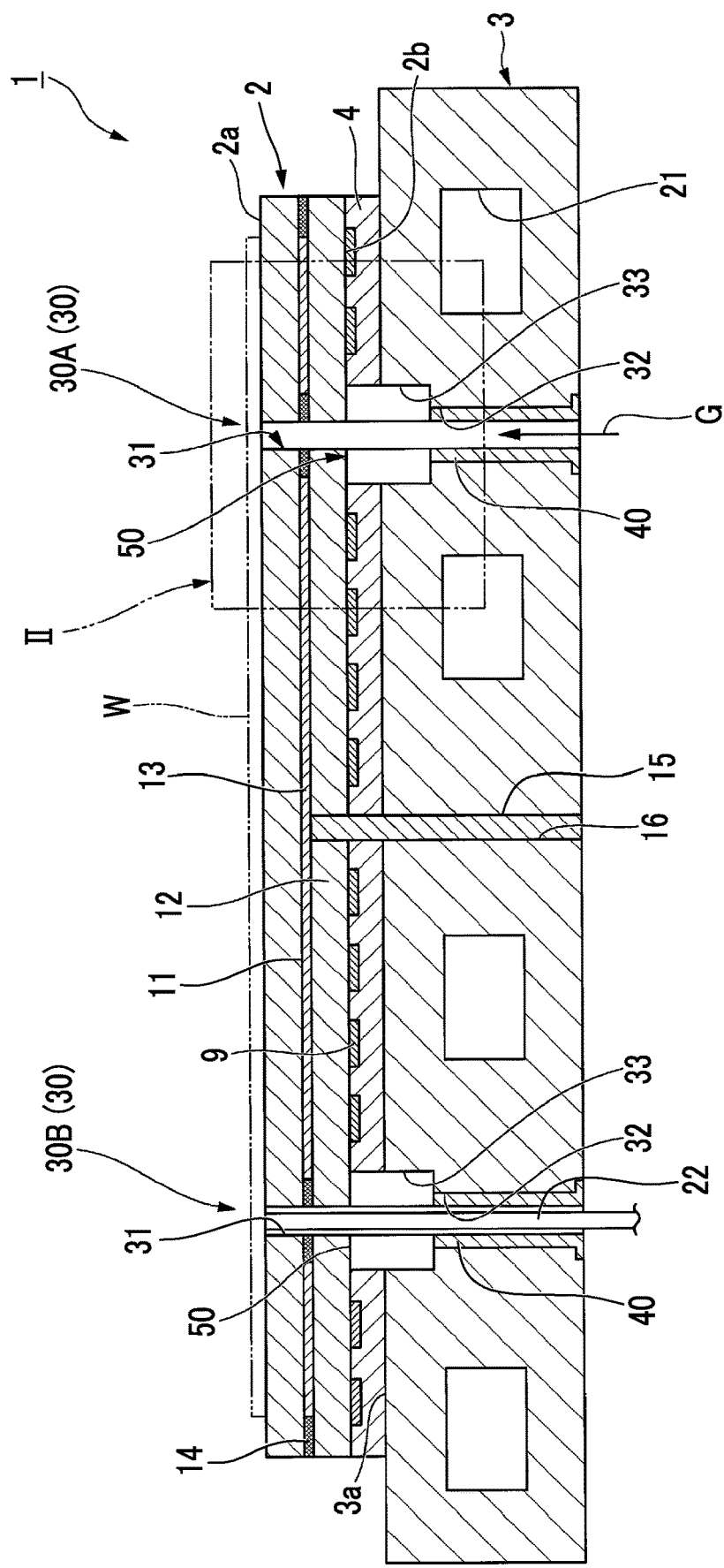
FIG. 1 is a schematic sectional view showing a preferred example of an electrostatic chuck device 1 of the present embodiment.

FIG. 1 is a schematic sectional view of an electrostatic chuck device 1 according to this embodiment. Further, FIG. 2 is a partially enlarged view of the electrostatic chuck device 1 and is an enlarged view of a region II shown in FIG. 1.

Figure 2:
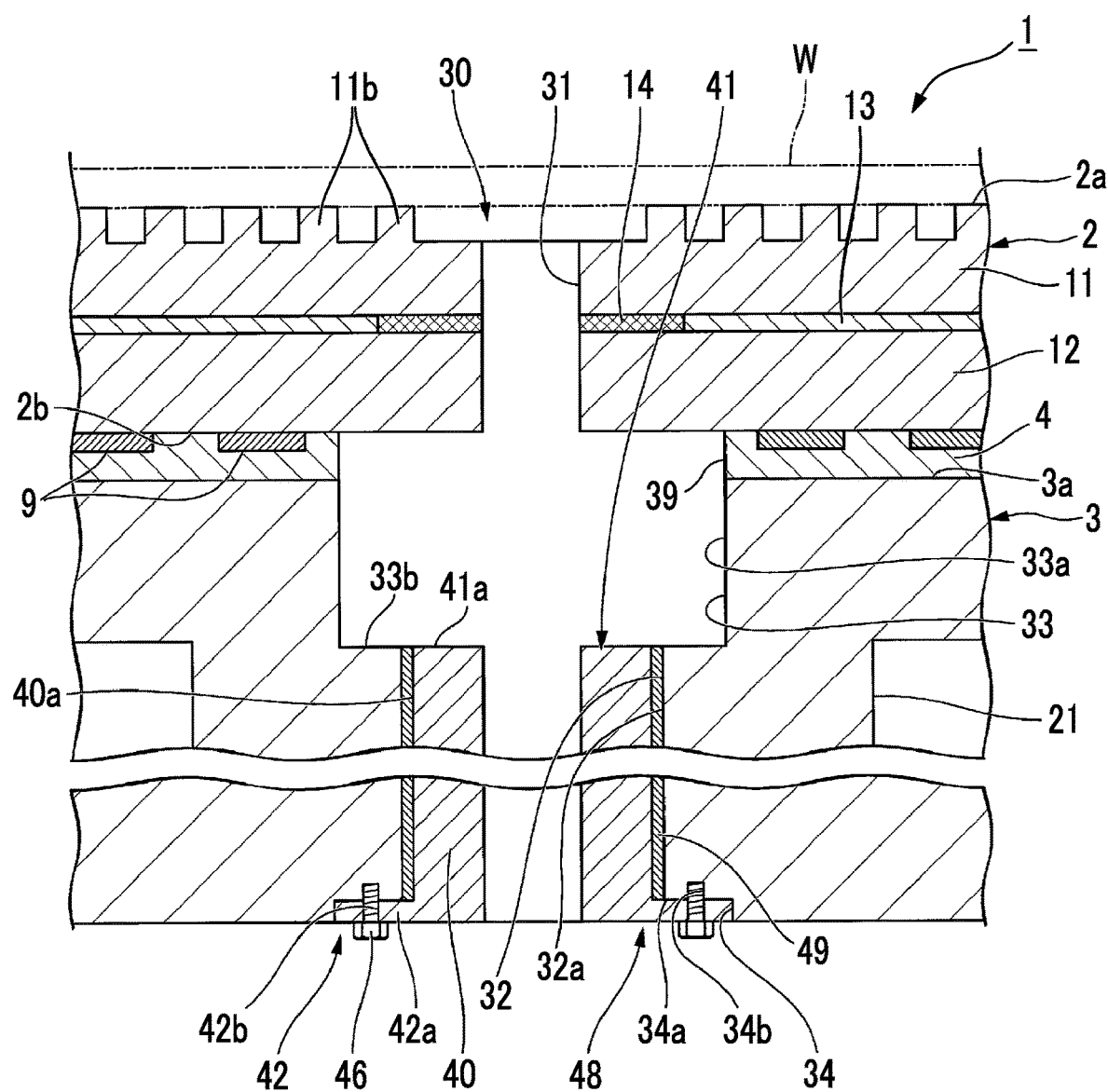
FIG. 2 is a partially enlarged view of the electrostatic chuck device 1.

As shown in FIGS. 1 and 2, the electrostatic chuck device 1 includes a disk-shaped electrostatic chuck part 2 having a mounting surface 2a on the one main surface (upper surface) side, a base part 3 provided below the electrostatic chuck part 2 to adjust the temperature of the electrostatic chuck part 2 to a desired temperature, a heater 9 disposed between the electrostatic chuck part 2 and the base part 3; and an adhesion layer 4 which bonds and integrates the electrostatic chuck part 2 and the base part 3 together.

In this specification, the relative position of the respective configurations will be described with the mounting surface 2a side being the upper side of the electrostatic chuck device 1 and the base part 3 side being the lower side of the electrostatic chuck device 1. However, the posture of the electrostatic chuck device 1 in use is not limited to this direction.

(Electrostatic Chuck Part)

The electrostatic chuck part 2 includes a placing plate 11 whose upper surface serves as the mounting surface 2a on which a plate-shaped sample W such as a semiconductor wafer is placed, a supporting plate 12 which is integrated with the placing plate 11 and supports the bottom portion side of the placing plate 11, an electrostatic attraction electrode 13 provided between the placing plate 11 and the supporting plate 12, and an insulating material layer 14 which insulates the periphery of the electrostatic attraction electrode 13.

The placing plate 11 and the supporting plate 12 are disk-shaped members in which the superposed surfaces thereof have the same shape. It is preferable that the placing plate 11 and the supporting plate 12 are made of an insulating ceramic sintered body having mechanical strength not to be damaged during the processing of the electrostatic chuck part 2 and during the use of the electrostatic chuck device 1 and having durability against corrosive gas and plasma thereof.

As an example of the ceramic sintered body described above, an aluminum oxide-silicon carbide ($Al_2O_3$—SiC) compound sintered body, an aluminum oxide ($Al_2O_3$) sintered body, an aluminum nitride (AlN) sintered body, an yttrium oxide ($Y_2O_3$) sintered body, or the like can be preferably given.

A plurality of protrusion portions 11b each having a diameter smaller than the thickness of the plate-shaped sample are preferably formed at predetermined intervals on the mounting surface 2a of the placing plate 11. An imaginary plane connecting the top surfaces of the plurality of protrusion portions 11b corresponds to the mounting surface 2a. The plurality of protrusion portions 11b support the plate-shaped sample W.

The thickness of the entirety including the placing plate 11, the supporting plate 12, the electrostatic attraction electrode 13, and the insulating material layer 14, that is, the thickness of the electrostatic chuck part 2 can be optionally selected. However, as a preferred example, the thickness can be formed in a thickness of 0.7 mm or more and 5.0 mm or less.

For example, if the thickness of the electrostatic chuck part 2 does not fall below 0.7 mm, it becomes easy to secure the mechanical strength of the electrostatic chuck part 2. If the thickness of the electrostatic chuck part 2 does not exceed 5.0 mm, the thermal capacity of the electrostatic chuck part 2 does not become too large, and the electrostatic chuck part 2 becomes easier to respond in a case where the temperature of the electrostatic chuck part 2 is controlled by the heater 9 or the base part 3 (described later). Further, if the thickness of the electrostatic chuck part 2 does not exceed 5.0 mm, heat transfer in a lateral direction of the electrostatic chuck part 2 does not easily increase and the in-plane temperature of the plate-shaped sample W can be easily maintained at a desired temperature pattern. The thickness of each part described here is an example and is not limited to the above range.

The electrostatic attraction electrode 13 is used as an electrostatic chucking electrode for generating electric charges on the mounting surface 2a and fixing the plate-shaped sample W with the generated electrostatic attraction force. The shape or size of the electrostatic attraction electrode 13 is appropriately adjusted according to the use.

It is preferable that the electrostatic attraction electrode 13 is formed of conductive ceramics or a high melting point metal.

The conductive ceramics can be optionally selected. However, an aluminum oxide-tantalum carbide ($Al_2O_3$—

Ta$_4$C$_5$) conductive compound sintered body, an aluminum oxide-tungsten (Al$_2$O$_3$—W) conductive compound sintered body, an aluminum oxide-silicon carbide (Al$_2$O$_3$—SiC) conductive compound sintered body, an aluminum nitride-tungsten (AlN—W) conductive compound sintered body, an aluminum nitride-tantalum (AlN—Ta) conductive compound sintered body, an yttrium oxide-molybdenum (Y$_2$O$_3$—Mo) conductive compound sintered body, or the like can be preferably given as an example.

As the high melting point metal, tungsten (W), tantalum (Ta), molybdenum (Mo), or the like can be given as an example.

The thickness of the electrostatic attraction electrode 13 is not particularly limited. However, for example, a thickness of 0.1 µm or more and 100 µm or less can be selected, and a thickness of 5 µm or more and 20 µm or less is more preferable.

If the thickness of the electrostatic attraction electrode 13 does not fall below 0.1 µm, it becomes easy to secure sufficient conductivity. If the thickness of the electrostatic attraction electrode 13 does not exceed 100 µm, cracks due to the difference in thermal expansion coefficient between the electrostatic attraction electrode 13, and the placing plate 11 and the supporting plate 12 does not easily occur in the bonded interface between the electrostatic attraction electrode 13, and the placing plate 11 and the supporting plate 12.

The electrostatic attraction electrode 13 having such a thickness can be easily formed by a manufacturing method which is optionally selected, for example, a film formation method such as a sputtering method or a vapor deposition method, or a coating method such as a screen printing method.

The insulating material layer 14 is disposition so as to surround the electrostatic attraction electrode 13. The insulating material layer 14 protects the electrostatic attraction electrode 13 from corrosive gas and plasma thereof and joins and integrates a boundary portion between the placing plate 11 and the supporting plate 12, that is, a region of an outer peripheral portion other than the electrostatic attraction electrode 13. The insulating material layer 14 is preferably formed of an insulating material having the same composition or the same main component as the material for forming the placing plate 11 and the supporting plate 12.

A power supply terminal 15 for applying a direct-current voltage to the electrostatic attraction electrode 13 is connected to the electrostatic attraction electrode 13. The power supply terminal 15 is inserted into a through-hole 16 penetrating the base part 3, an adhesive layer 8, and the supporting plate 12 in a thickness direction. An insulator (not shown) having insulating properties is provided on the outer peripheral side of the power supply terminal 15, so that the base part 3 made of metal and the power supply terminal 15 are insulated from each other.

(Base Part)

The base part 3 is for adjusting the temperature of the electrostatic chuck part 2 to a desired temperature and is a thick disk-shaped member. Further, the base part 3 may also have the function of a high-frequency generation electrode.

A flow path 21 for circulating a cooling medium such as water or an organic solvent is preferably formed in the interior of the base part 3. As the base part 3, a water-cooled base in which as a refrigerant, water circulates through the flow path 21 can be suitably used. The shape of the flow path 21 when viewed in a plan view can be optionally selected. For example, a spiral shape, a meandering shape, a linear shape, a shape obtained by optionally combining two or three or more of these shapes, or the like can be given as an example.

The material for forming the base part 3 is not particularly limited as long as it is a metal having excellent thermal conductivity, electrical conductivity, and workability, or a compound material containing the metal. For example, aluminum (Al), an aluminum alloy, copper (Cu), a copper alloy, stainless steel (SUS), or the like can be suitable used.

It is preferable that at least a surface of the base part 3, which is exposed to plasma, is subjected to alumite treatment or an insulating film such as alumina is formed thereon. In this way, in addition to improvement in plasma resistance, an abnormal discharge is suppressed and plasma resistance stability is improved. Further, the surface of the base part 3 whose surface is subjected to alumite treatment is not easily damaged.

(Heater)

The heater 9 is fixed to a lower surface 2b of the electrostatic chuck part 2 through an adhesive (not shown).

Further, the heater 9 is embedded in the adhesion layer 4 between the lower surface 2b of the electrostatic chuck part 2 and an upper surface 3a of the base part 3.

The heater 9 is configured with a conductive member having a shape in which a narrow band-shaped metal material meanders. The heater 9 has a continuous band shape, and the shape, length, or thickness thereof can be optionally selected. A plurality of heaters 9 may be provided as necessary. The heater 9 may be connected to a power supply terminal at both ends thereof and generate heat when an electric current flows therethrough, thereby controlling the temperature of the electrostatic chuck part 2.

The heater 9 is obtained, for example, by processing a nonmagnetic metal thin plate having a constant thickness of 0.2 mm or less, preferably about 0.1 mm into a desired heater shape by a photolithography method or laser processing. As the nonmagnetic metal thin plate, a titanium (Ti) thin plate, a tungsten (W) thin plate, a molybdenum (Mo) thin plate, or the like can be given as an example. As the shape of the heater, a shape in which a band-shaped conductive thin plate meanders and an annular shape as an overall contour of the heater can be given as an example.

The heater 9 as described above is obtained, for example, by bonding a nonmagnetic metal thin plate to the electrostatic chuck part 2 and then processing and formed it on the surface of the electrostatic chuck part 2. Further, the heater 9 processed and formed at a position different from that of the electrostatic chuck part 2 may be transferred and printed on the surface of the electrostatic chuck part 2. Further, the heater 9 may be built in the interior of the electrostatic chuck part 2.

(Adhesion Layer)

The adhesion layer 4 is interposed between the lower surface 2b of the electrostatic chuck part 2 and the upper surface 3a of the base part 3 to bond and integrate the electrostatic chuck part 2 and the base part 3 together. The heater 9 attached to the lower surface 2b of the electrostatic chuck part 2 is buried in the adhesion layer 4.

The adhesion layer 4 is preferably an adhesive having heat resistance in a temperature range of −20° C. to 150° C. As a material for forming the adhesion layer 4, for example, an acrylic resin, a silicone-based resin, an epoxy resin, or the like is suitable.

As the material for forming the adhesion layer 4, a material having high resistance to a use environment may be selected and used according to an environment in which the electrostatic chuck device 1 is used. For example, in a case where the electrostatic chuck device 1 is used in an environment of oxygen-based plasma, as the material for forming the adhesion layer 4, a silicone-based resin having excellent plasma resistance to oxygen-based plasma is preferable.

The adhesion layer 4 may be a cured film obtained by thermocompression bonding of a liquid thermosetting adhesive coating film.

(Cooling Gas Introduction Hole and Pin Insertion Hole)

The electrostatic chuck part 2, the base part 3, and the adhesion layer 4 are provided with a plurality of cooling gas introduction holes 30A and a plurality of pin insertion holes 30B penetrating them up and down.

The cooling gas introduction hole 30A is provided for supplying a cooling gas G such as helium (He) toward the plate-shaped sample W placed on the electrostatic chuck part 2.

Further, a lift pin 22 which assists in the separation of the plate-shaped sample W attracted and attached to the mounting surface 2a is inserted into the pin insertion hole 30B. A drive unit (not shown) is connected to a lower end of the lift pin 22, and drives the lift pin 22 up and down along the direction in which the pin insertion hole 30B penetrates.

The cooling gas introduction hole 30A and the pin insertion hole 30B can have the same configuration. In the following description, the cooling gas introduction hole 30A and the pin insertion hole 30B will be collectively referred to simply as a through-hole 30.

The through-hole 30 has a first through-holes 31 that is a portion penetrating the electrostatic chuck part 2, a second through-holes 32 that is a portion penetrating the base part 3, and a third through-hole 39 that is a portion penetrating the adhesion layer 4.

The first through-hole 31, the second through-hole 32, and the third through-hole 39 have central axes which coincide with each other. A tubular insulator 40 is fixed to an inner peripheral surface 32a of the second through-hole 32.

As shown in the drawings, a counterbore hole 33 (a first counterbore hole) having a diameter larger than that of the second through-hole 32 may be provided at an opening on the electrostatic chuck part 2 side (the upper side) of the second through-hole 32. The counterbore hole 33 has a circular shape concentric with the second through-hole 32 and communicates with the second through-hole 32.

As shown in the drawings, a second counterbore hole 34 having a diameter larger than that of the second through-hole 32 may be provided at an opening of the second through-hole 32 on the side opposite to the electrostatic chuck part 2 (the lower side). The counterbore hole 34 has a circular shape concentric with the second through-hole 32 and communicates with the second through-hole 32. The counterbore hole 34 is provided with a fixing surface 34a facing downward. A plurality of screw holes 34b are formed in the fixing surface 34a.

(Insulator)

The insulator 40 is formed of a material which is optionally selected, for example, ceramic. The insulator 40 has durability against plasma. As the ceramics for forming the insulator 40, ceramics including one kind or two or more kinds selected from aluminum nitride (AlN), aluminum oxide ($Al_2O_3$), silicon nitride ($Si_3N_4$), zirconium oxide ($ZrO_2$), sialon, boron nitride (BN), and silicon carbide (SiC) can be preferably adopted.

The insulator 40 has a first end portion 41 which is located on the electrostatic chuck part 2 side, and a second end portion 42 which is located on the side opposite thereto. The inner diameter of the insulator 40 shown in the drawings is substantially equal to the inner diameter of the first through-hole 31. In a case where the through-hole 30 is the cooling gas introduction hole 30A, the inner diameter of the insulator 40 may be larger than the inner diameter of the first through-hole 31.

An adhesion layer 49 is interposed between an outer peripheral surface 40a of the insulator 40 and the inner peripheral surface 32a of the second through-hole 32 to bond and fix the insulator 40 and the electrostatic chuck part 2 together. A material for forming the adhesion layer 49 can be optionally selected. However, an organic resin having durability against plasma and flexibility is preferably used.

An annular flange portion 42a is preferably provided at the second end portion 42 of the insulator 40. A through-hole 42b penetrating in the thickness direction (up-down direction) of the flange portion is formed in the flange portion 42a.

The flange portion 42a is accommodated in the counterbore hole 34. A worker can fix the insulator 40 to the base part 3 by inserting a screw 46 into the through-hole 42b of the flange portion 42a and fastening the screw 46 to the screw hole 34b of the base part 3. The flange portion 42a and the screw 46 configure a fixed portion 48 of the insulator 40.

The insulator 40 shown in the drawings is fixed to the base part 3 by the fixed portion 48 and an adhesion layer 49.

The aspect of fixing the insulator 40 is not limited to this, and the insulator 40 may be fixed to the base part 3 by using only the adhesion layer 49 without using the fixed portion 48. In this case, the flange portion 42a and the screw 46 configuring the fixed portion 48 become unnecessary.

Further, the insulator 40 may be fixed to the base part 3 by using only the fixed portion 48 without using the adhesion layer 49. In a case where the insulator 40 is fixed to the base part 3 by using only the fixed portion, the insulator 40 can be attached to and detached from the base part 3.

Further, in this embodiment, the insulator 40 is fixed to the base part 3 by the screws 46 at the flange portion 42a. However, the method of fixing the insulator 40 is not limited to this. For example, a configuration may be adopted in which a male screw is formed on the outer peripheral surface of the flange portion 42a, a female screw is formed on the inner peripheral surface of the counterbore hole 34 of the base part 3, and these screws are screwed together to fix the insulator 40. In this case, the flange portion 42a and the insulator 40 may be formed separately.

In the electrostatic chuck device 1 of this embodiment, an end 41a on the electrostatic chuck part 2 side of the insulator 40 is separated from the electrostatic chuck part 2 with a space interposed therebetween. That is, a space (gap) where no other member exists is present between the end 41a and the electrostatic chuck part 2.

In the insulator 40 shown in the drawings, the height position of the end 41a is the same as the height position of a bottom surface 33b of the counterbore hole 33, and the entire insulator 40 is buried in the second through-hole 32.

The electrostatic chuck device 1 as described above has the following effects.

Figure 3:
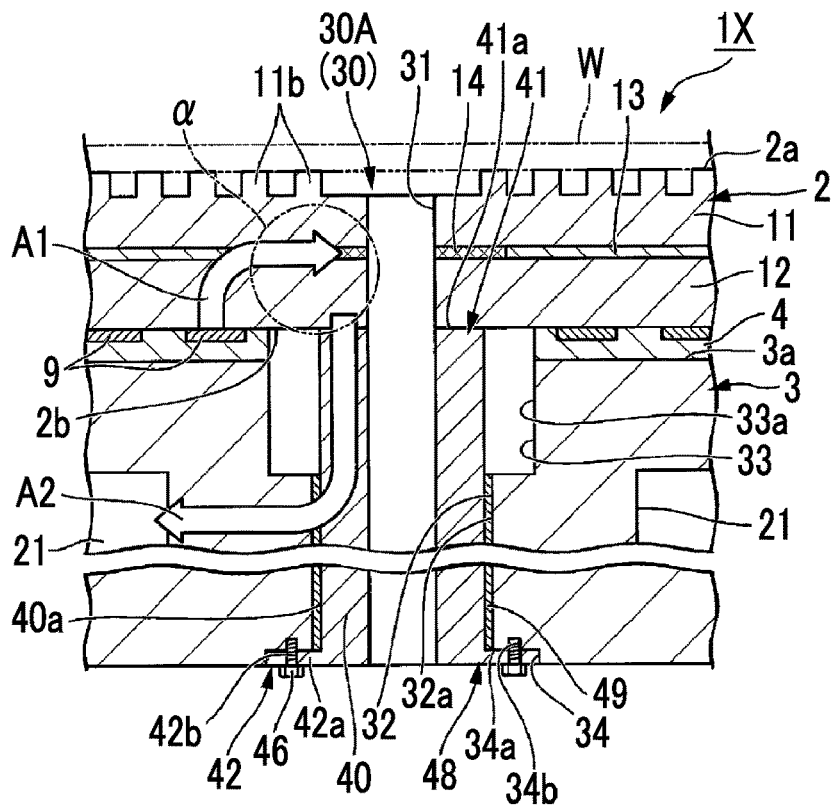
FIG. 3 is a diagram for describing a state of an electrostatic chuck device 1X of a comparative example.

FIG. 3 is a diagram for describing a state in use of an electrostatic chuck device 1X as a comparative example.

Figure 4:
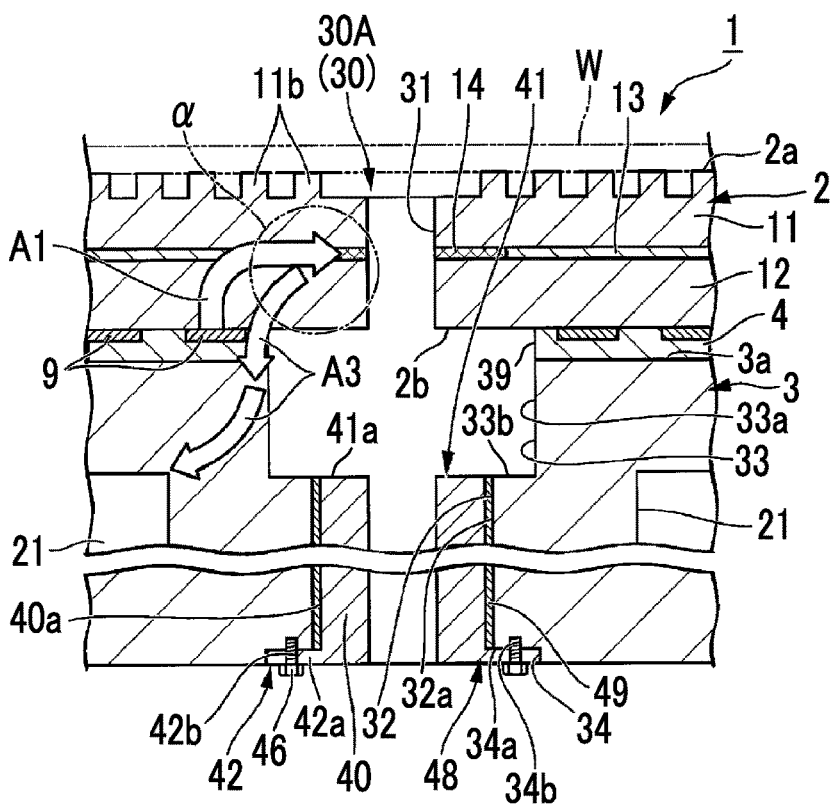
FIG. 4 is a diagram for describing a preferable effect of the electrostatic chuck device 1.

FIG. 4 is a diagram for describing the effect of the electrostatic chuck device 1. FIGS. 3 and 4 are sectional views of the same field of view as that in FIG. 2.

In the drawings, the movement of heat which is generated from the heater 9 is indicated by white arrows. In FIGS. 3 and 4, the direction of the white arrow indicates the direction in which the heat is directed. In the following description, the state of the movement of the heat at the periphery of the through-hole 30 of the electrostatic chuck part 2 will be described. In FIGS. 3 and 4, the "periphery of the through-hole 30" is indicated as a region α, and the movement of the heat in the region α will be described.

First, in the electrostatic chuck devices 1 and 1X having the through-holes 30, in common, the heater 9 cannot be provided at a position overlapping the through-holes 30 in a plane. For this reason, as indicated by a white arrow A1, the region α is heated by the heat transmitted from the heater 9 provided at the position closest to the region α.

In the electrostatic chuck device 1X shown in FIG. 3, the end 41a of the insulator 40 is in contact with the electrostatic chuck part 2. The insulator 40 comes into contact with both the electrostatic chuck part 2 and the base part 3.

At this time, the insulator 40 has a temperature gradient in which the first end portion 41 side is heated by the electrostatic chuck part 2 to have a high temperature and the second end portion 42 side is cooled by the base part 3 to have a low temperature. For this reason, the heat transmitted to the region α is easily transmitted to the base part 3 through the insulator 40 by the movement along the temperature gradient, as indicated by a white arrow A2, and is released to the flow path 21 through which the refrigerant flows. Further, the insulator 40 made of ceramic has a higher thermal conductivity than the adhesion layer 4 made of resin. For this reason, the region α is easily cooled by the presence of the insulator 40.

In contrast, in the electrostatic chuck device 1 shown in FIG. 4, the end 41a of the insulator 40 is not in contact with the electrostatic chuck part 2. For this reason, the heat transmitted to the region α is transmitted to the base part 3 through the electrostatic chuck part 2 and the adhesion layer 4, as indicated by a white arrow A3, and is released to the flow path 21 through which the refrigerant flows.

At this time, the electrostatic chuck part 2 has a temperature gradient in which the side close to the heater 9 has a high temperature due to the heating from the heater 9 and the region α side has a low temperature. Therefore, when the heat transmitted to the region α is transmitted as indicated by the white arrow A3, it opposes the temperature gradient. For this reason, the heat is not easily transmitted and is not easily released to the flow path 21. Further, the adhesion layer 4 disposed between the electrostatic chuck part 2 and the base part 3 has a lower thermal conductivity than the insulator 40 made of ceramic. For this reason, the region α of the electrostatic chuck device 1 is not easily cooled as compared with the electrostatic chuck device 1X.

In the above description, it has been described that the heating is performed by the heater 9. However, even if heat input from plasma during the use of the device is taken into consideration as a heat source, similarly, in the electrostatic chuck device 1, no heat is released from the region α through the insulator 40. For this reason, it becomes harder to be cooled as compared with the electrostatic chuck device 1X.

In this way, in the electrostatic chuck device 1, the region α becomes hard to be cooled, and thus it becomes possible to reduce the in-plane temperature difference of the plate-shaped sample W placed on the mounting surface 2a.

As described above, in the electrostatic chuck device 1, by adopting a configuration in which the end 41a of the insulator 40 is not in contact with the electrostatic chuck part 2, a configuration can be made in which the release of heat from the periphery (region α) of the through-hole 30 is suppressed, so that the region α becomes hard to be cooled. The electrostatic chuck device 1 as described above can be used in combination with a configuration in which the periphery of the through-hole 30 is easily heated, as described below.

Figure 5:
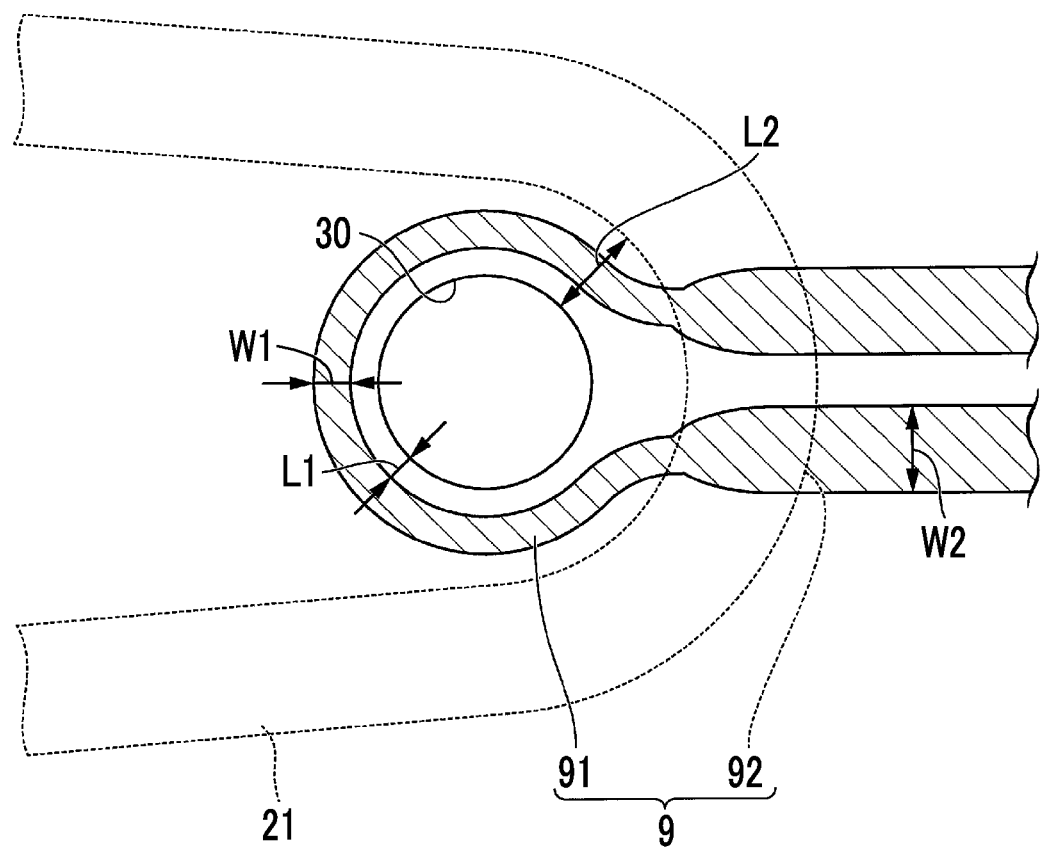
FIG. 5 is a schematic plan view showing a preferred example of a peripheral structure of a through-hole 30.

FIG. 5 is a schematic plan view showing a preferred example of the peripheral structure of the through-hole 30.

The heater 9 shown in the drawing has a band-shaped first portion 91 formed so as to surround the through-hole 30 when viewed in a plan view, and a band-shaped second portion 92 formed farther from the through-hole 30 than the first portion 91. The first portion 91 and the second portion 92 are continuous. Further, the width of the first portion 91 is provided to be smaller than the width of the second portion 92. The band-shaped first portion 91 has the shape of an alphabet C, that is, an unclosed ring shape. The shape of the flow path 21 shown in the drawing is a preferred example, but is not limited thereto.

The heater performs heating by utilizing resistance heat generation when a band-shaped conductive thin plate is energized. A width W1 of the first portion 91 is smaller than a width W2 of the second portion 92, so that it can be expected that the amount of heat generation in the first portion 91 increases more than that in the second portion 92. For this reason, if the heater 9 having such a configuration is used, the amount of heat which is supplied to the periphery of the through-hole 30 is increased as compared with a case where the heater is located far from the through-hole 30, and thus the temperature of the periphery of the through-hole 30 is easily increased.

Further, the heater 9 shown in the drawing is configured such that a minimum value L1 of the distance between the first portion 91 and the through-hole 30 when viewed in a plan view is smaller than a minimum value L2 of the distance between the flow path 21 through which the refrigerant flows and the through-hole 30 when viewed in a plan view. That is, the heater 9 is provided closer to the through-hole 30 than the flow path 21 when viewed in a plan view. For this reason, if the positions of the heater 9 and the flow path 21 have such a relationship, the periphery of the through-hole 30 is easily heated, and thus the temperature of the periphery of the through-hole 30 is easily increased.

In this way, in the electrostatic chuck device 1, the temperature of the region α can be easily increased, and thus it becomes possible to reduce the in-plane temperature difference of the plate-shaped sample W placed on the mounting surface 2a.

According to the electrostatic chuck device 1 configured as described above, it becomes possible to reduce the in-plane temperature difference of the plate-shaped sample W placed on the mounting surface 2a.

Further, the minimum distance between the heater 9 and the inner peripheral surface of the second through-hole when viewed in a plan view can be optionally selected according to conditions. For example, the distance is preferably in a range of 0.3 to 0.7 with respect to the minimum distance L1 between the first portion and the through-hole. With such a distance, an effect of achieving both the withstand voltage and the temperature uniformity can be obtained.

Further, the minimum distance between the heater 9 and the side surface of the counterbore hole when viewed in a plan view can also be optionally selected according to conditions. For example, the distance is preferably in a range of 0.2 to 0.8, and more preferably in a range of 0.3 to 0.6, with respect to the minimum distance L1 between the first portion and the through-hole. With such a distance, an effect of achieving both the withstand voltage and the temperature uniformity can be obtained.

The preferred embodiments of the present invention have been described above with reference to the accompanying drawings. However, it goes without saying that the present invention is not limited to such embodiments. The various shapes, combinations, and the like of the respective constituent members shown in the examples described above are merely examples, and various changes can be made based on design requirements within a scope which does not depart from the gist of the present invention.

INDUSTRIAL APPLICABILITY

According to the present invention, an electrostatic chuck device having a novel structure in which it is possible to reduce an in-plane temperature difference of a plate-shaped sample can be provided.

REFERENCE SIGNS LIST

1: electrostatic chuck device
1X: electrostatic chuck device of comparative example
2: electrostatic chuck part
2a: mounting surface
2b: lower surface of electrostatic chuck part
3: base part
3a: upper surface of base part
4: adhesion layer
9: heater
11: placing plate
12: supporting plate
13: electrostatic attraction electrode
14: insulating material layers
15: power supply terminal 16: through-hole
21: flow path
22: lift pins
30: through-hole
30A: cooling gas introduction hole
30B: pin insertion hole
31: first through-hole
32: second through-hole
32a: Inner peripheral surface of second through-hole
33: counterbore hole
33a: side surface of counterbore hole
33b: bottom surface of counterbore hole
34: large diameter counterbore hole
34a: fixing surface of large diameter counterbore hole
34b: screw hole
39: third through-hole
40: Insulator
40a: outer peripheral surface of insulator
41: first end portion of insulator
41a: end (top surface) of insulator
42: second end portion of insulator
42a: flange portion
42b: through-hole
46: screw
48: fixed portion
49: adhesion layers
50: bottom surface of supporting plate
91: first portion
92: second portion
A1, A2, A3: white arrow (heat)
G: cooling gas
L1: minimum distance between first portion and through-hole
L2: minimum distance between flow path and through-hole
W: plate-shaped sample
W1: width of first portion
W2: width of second portion
α: region
II: region

The invention claimed is:

1. An electrostatic chuck device comprising:
an electrostatic chuck part which has, as a main surface, a mounting surface on which a plate-shaped sample is mounted, and is provided with an electrostatic attraction electrode;
a base part which is disposed on a side opposite to the mounting surface with respect to the electrostatic chuck part and is configured to cool the electrostatic chuck part;
a heater which is disposed in a layered manner between the electrostatic chuck part and the base part or in an interior of the electrostatic chuck part; and
an adhesion layer which bonds and integrates the electrostatic chuck part and the base part together,
wherein the electrostatic chuck part is provided with a first through-hole,
the base part is provided with a second through-hole communicating with the first through-hole,
the adhesion layer is provided with a third through-hole communicating with the first through-hole and the second through-hole,
a tubular insulator is fixed in the second through-hole, and
an end of the insulator which is located on the electrostatic chuck part side is separated from the electrostatic chuck part with a space interposed therebetween.

2. The electrostatic chuck device according to claim 1, wherein the base part has a counterbore hole, which communicates with the second through-hole, has a larger diameter than a diameter of the second through-hole, and is provided on a surface of the base part on the electrostatic chuck part side.

3. The electrostatic chuck device according to claim 2, wherein the first through-hole, the third through-hole, the counterbore hole, and the second through-hole have concentric circular shapes when viewed in a plan view and communicate with each other in this order, and
a height of the end of the insulator located in the second through-hole is equal to a height of a bottom surface of the counterbore hole.

4. The electrostatic chuck device according to claim 1, wherein the third through-hole has a larger diameter than a diameter of the first through-hole.

5. The electrostatic chuck device according to claim 1, wherein the heater has a band-shaped first portion which is formed to surround the first through-hole when viewed in a plan view, and
a band-shaped second portion which is formed farther from the first through-hole than the first portion,
the first portion and the second portion are connected to each other, and
a width of the first portion is smaller than a width of the second portion.

6. The electrostatic chuck device according to claim 1, wherein the base part has a flow path through which a refrigerant flows,
the heater has a band-shaped first portion which is formed to surround the first through-hole when viewed in a plan view, and
a minimum value of a distance between the first portion and the first through-hole when viewed in a plan view is smaller than a minimum value of a distance between the flow path and the first through-hole when viewed in a plan view.

7. The electrostatic chuck device according to claim 1, wherein the insulator has an end portion on a side opposite to the electrostatic chuck part, wherein the end portion has a fixed portion which is detachably fixed to the base part.

8. The electrostatic chuck device according to claim 1, wherein an inner diameter of the first through-hole and an inner diameter of the tubular insulator are equal to each other.

9. The electrostatic chuck device according to claim 1, wherein an inner diameter of the tubular insulator is larger than an inner diameter of the first through-hole.

* * * * *